United States Patent [19]

Yoshikawa et al.

[11] Patent Number: 5,796,165
[45] Date of Patent: Aug. 18, 1998

[54] HIGH-FREQUENCY INTEGRATED CIRCUIT DEVICE HAVING A MULTILAYER STRUCTURE

[75] Inventors: Noriyuki Yoshikawa, Osaka; Kunihiko Kanazawa, Kyoto; Satoshi Makioka, Shiga; Kazuki Tateoka, Osaka, all of Japan

[73] Assignee: Matsushita Electronics Corporation, Osaka, Japan

[21] Appl. No.: 638,264

[22] Filed: Apr. 26, 1996

[30] Foreign Application Priority Data

Mar. 19, 1996 [JP] Japan .................................. 8-062368

[51] Int. Cl.$^6$ .......................... H01L 27/01; H01L 23/14; H01L 23/50; H01L 23/12
[52] U.S. Cl. .................. 257/728; 257/700; 257/723; 257/724; 257/713; 257/698; 257/712
[58] Field of Search ...................... 257/700, 686, 257/698, 699–706, 708, 712, 713, 717, 720, 728, 723–725, 758, 778

[56] References Cited

U.S. PATENT DOCUMENTS

| | | | |
|---|---|---|---|
| 4,922,344 | 5/1990 | Sudo | 257/700 |
| 5,008,734 | 4/1991 | Dutta et al. | 257/700 |
| 5,235,208 | 8/1993 | Katoh | 257/698 |
| 5,317,196 | 5/1994 | Wong | 257/778 |
| 5,384,691 | 1/1995 | Neugebauer et al. | 257/700 |
| 5,490,324 | 2/1996 | Newman | 257/700 |
| 5,510,758 | 4/1996 | Fujita et al. | 257/728 |
| 5,523,422 | 6/1996 | Harada et al. | 257/778 |
| 5,567,983 | 10/1996 | Hirano et al. | 257/723 |
| 5,572,065 | 11/1996 | Burns | 257/704 |

FOREIGN PATENT DOCUMENTS

| | | | |
|---|---|---|---|
| 503200 | 9/1992 | European Pat. Off. | 257/700 |
| 2-198158 | 8/1990 | Japan | 257/700 |
| 4-150058 | 5/1992 | Japan | 257/700 |
| 5-275609 | 10/1993 | Japan | 257/700 |

*Primary Examiner*—Tom Thomas
*Assistant Examiner*—Alexander Oscar Williams
*Attorney, Agent, or Firm*—McDermott, Will & Emery

[57] ABSTRACT

A multilayer structure composed of a plurality of substrates stacked in layers is provided with a cavity formed by partially removing some of the substrates. A semiconductor chip internally provided with an active component such as an FET is mounted on the bottom face of the cavity. Passive components including a high-frequency matching circuit and a bias circuit are distributed in the uppermost layer, lowermost layer, and middle layer lying between the substrates of the multilayer structure. For example, a chip component partially composing the high-frequency matching circuit is disposed in the uppermost layer, while the bias circuit is disposed in the middle layer. Since only a reduced number of substrates underlie the semiconductor chip internally provided with the active component primarily serving as a heating element, an excellent heat dissipating ability is retained even when each of the substrates of the multilayer structure is composed of a versatile material such as alumina. By utilizing the characteristic, there can be implemented a high-frequency integrated circuit device exhibiting a high degree of integration and usable in mobile communication such as a portable telephone.

19 Claims, 9 Drawing Sheets

1 SEMICONDUCTOR CHIP
2 MULTILAYER STRUCTURE
3 CHIP COMPONENT
4 EDGE ELECTRODE
5 HIGH-MELTING-POINT SOLDERING MATERIAL
6 LOW-MELTING-POINT SOLDERING MATERIAL
7 POTTING RESIN
8 BONDING WIRE
12 CAVITY
13 BOTTOM FACE
14 MEZZANINE FACE
15 HEAT DISSIPATING ELECTRODE
16 PROTECTIVE COATING MATERIAL
17 METAL CASE

Fig. 1

1 SEMICONDUCTOR CHIP
2 MULTILAYER STRUCTURE
3 CHIP COMPONENT
4 EDGE ELECTRODE
5 HIGH-MELTING-POINT SOLDERING MATERIAL
6 LOW-MELTING-POINT SOLDERING MATERIAL
7 POTTING RESIN
8 BONDING WIRE
12 CAVITY
13 BOTTOM FACE
14 MEZZANINE FACE
15 HEAT DISSIPATING ELECTRODE
16 PROTECTIVE COATING MATERIAL
17 METAL CASE

HIGH-FREQUENCY INTEGRATED CIRCUIT DEVICE HAVING A MULTILAYER STRUCTURE

BACKGROUND OF THE INVENTION

The present invention relates to a high-frequency integrated circuit device for use in radio systems such as mobile communication and to a method for the manufacture thereof.

In recent years, compact and low-cost electronic circuit components have been in greater demand in mobile communication systems including a portable telephone and a car telephone. To meet the demand, there has predominantly been provided a conventional high-frequency integrated circuit device for practical applications, wherein a packaged semiconductor device and a chip component such as a chip capacitor are mounted on a single-layer substrate with an additional heat radiation plate and additional lead electrodes attached thereto. In such an arrangement, however, all circuit components are mounted on a surface of the single-layer substrate so that the substrate inevitably occupies a large area and the device is increased in size. Moreover, since the structure of the device is complicated, it is difficult to achieve a cost reduction. To overcome the difficulty, a semiconductor chip may be bonded directly onto a substrate made of a ceramic. However, the structure using such a substrate incurs a problem when a creamed solder is swept with a squeegee.

Figure 8:
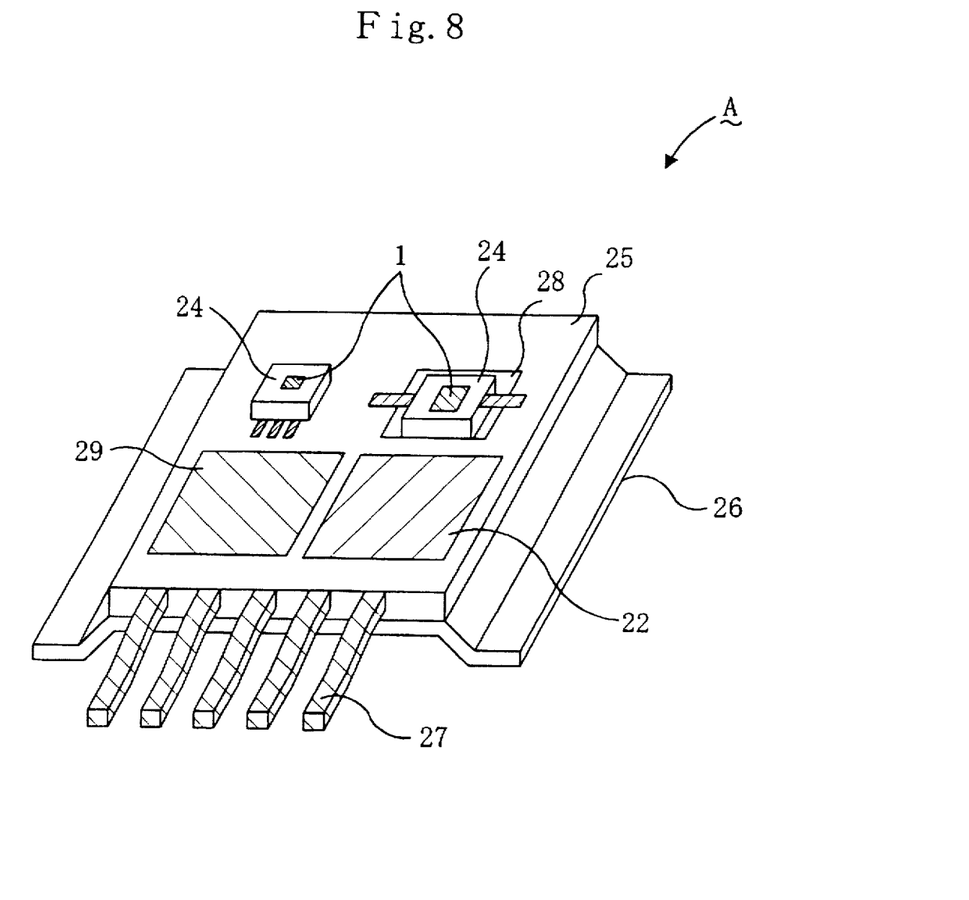
FIG. 8 is a perspective view of a first conventional high-frequency integrated circuit device.

Below, a description will be given to an example of a first conventional high-frequency integrated circuit device with reference to FIG. 8. As shown in the drawing, the high-frequency integrated circuit device A comprises a substrate 25 composed of a dielectric material such as ceramic, on which are mounted: two semiconductor devices 24 each containing a semiconductor chip 1 composed of a compound semiconductor; a bias circuit 29; and a high-frequency matching circuit 22 for matching impedances with respect to a high-frequency signal. In each of the semiconductor devices 24, the semiconductor chip 1 is die bonded, wire bonded, and then hermetically sealed in a package. Active components in each of the semiconductor chips 1 and members in each of the circuits 22 and 29 are electrically connected to an external circuit via electrode leads 27 attached to a side of the substrate 25.

In such a high-frequency integrated circuit device, a heat radiation plate 26 composed of copper tungsten (CuW) or the like and also serving as a metallic shield plate is typically attached to the back face of the substrate 25, so that heat generated in the high-frequency integrated circuit device, especially from the semiconductor chips 1, is dissipated to the outside via the heat radiation plate 26 itself or a circuit board (not shown) attached to the back face of the heat radiation plate 26. In the case where the semiconductor device 24 generates an extremely large amount of heat, it is designed to be in intimate contact with the heat radiation plate 26 through a semiconductor-device mounting hole 28.

However, in the arrangement of the first conventional high-frequency integrated circuit device described above, the thickness of the substrate should be reduced to promote heat radiation since the substrate composed of alumina with a comparatively high thermal conductivity has a low thermal conductivity of about 18 W/mK. As a result, a multilayer substrate cannot be implemented and hence the circuit components are arranged only in two dimensions, which increases the circuit in size. Moreover, in the case where satisfactory heat radiation is required, the semiconductor-device mounting hole 28 is formed in the substrate 25 to provide intimate contact between the semiconductor device 24 and the heat radiation plate 26, resulting in higher cost. Furthermore, the electrode leads 27 are formed extracted from the single-layer substrate 25, which increases the device in size and the area occupied by the mounted circuit components.

Figure 9:
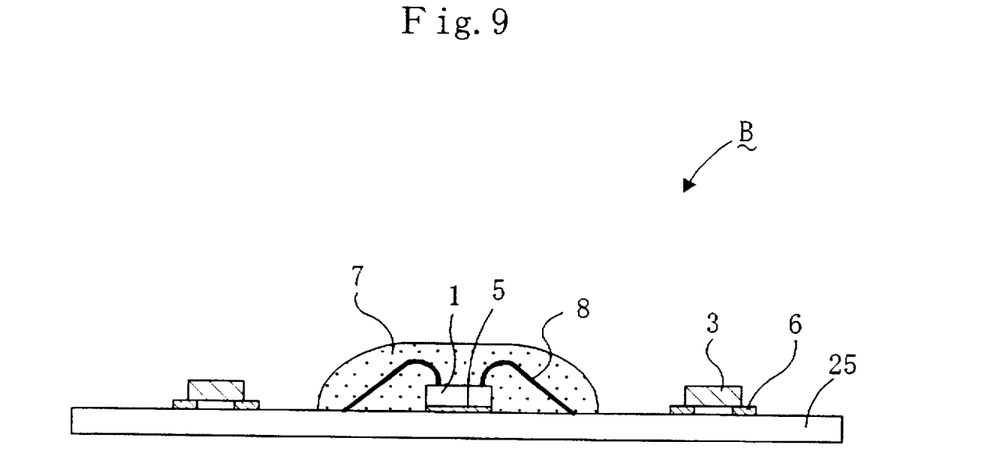
FIG. 9 is a cross-sectional view of a second conventional high-frequency integrated circuit device.

FIG. 9 shows the arrangement of a second conventional integrated circuit device B. As shown in the drawing, a semiconductor chip 1 such as a transistor is bonded onto a substrate 25 composed of a ceramic material with the use of a high-melting-point soldering material 5 and the components of the semiconductor chip 1 are connected to electrodes (not shown) formed on the substrate 25 by means of bonding wires 8. The semiconductor chip 1 and the bonding wires 8 are hermetically sealed with a potting resin 7. Onto another portion of the semiconductor substrate 25, a chip component 3 such as a capacitor for resistance is bonded using a low-melting-point soldering material 6.

Below, a method for the manufacture of the above second conventional high-frequency integrated circuit device will be roughly described. First, the semiconductor chip 1 is die bonded onto the substrate 25 with the use of the high-melting-point soldering material 5. Thereafter, the electrodes on the semiconductor chip 1 are connected to interconnect electrodes formed on a surface of the substrate 25 by means of the bonding wires 8 and the potting resin 7 is applied onto the semiconductor chip 1 and bonding wires 8 and then cured. Subsequently, a creamed solder as a low-melting-point soldering material 6 is selectively applied onto the regions of the substrate 25 except for the portions hermetically sealed with the resin by using a mask for soldering, followed by the mounting of the chip component 3 and the process of solder reflow, thereby completing the second conventional high-frequency integrated circuit device.

Figure 10:
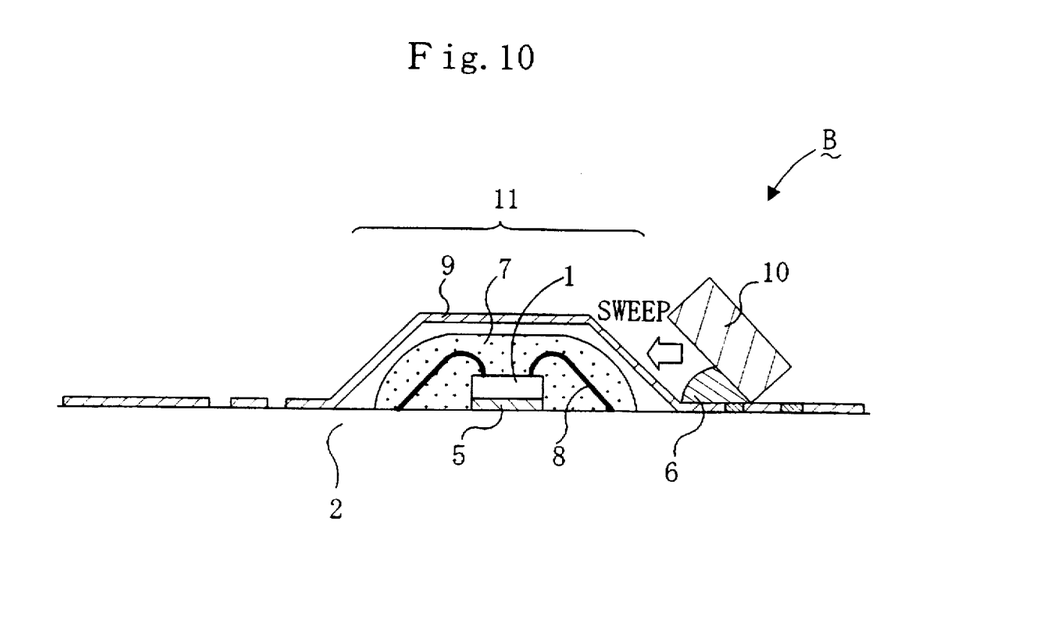
FIG. 10 is a cross-sectional view partially illustrating the process of manufacturing the second conventional high-frequency integrated circuit device.

FIG. 10 is a cross-sectional view illustrating the process of applying the creamed solder. A mask for soldering 9 with openings corresponding only to the regions to be coated with the creamed solder is attached onto the potting resin 7 and substrate 25. The mask for soldering 9 has previously been formed with an embossment 11 for preventing interference with the potting resin used to hermetically seal the bonded semiconductor chip 1 and the bonding wires 8. By sweeping the creamed solder with a squeegee, the creamed solder as the low-melting-point material 6 is filled in the openings formed in the mask for soldering 9. By removing the mask for soldering 9 afterwards, the creamed solder is applied onto given portions to be soldered.

However, the above second conventional high-frequency integrated circuit device has the following problems.

(1) In the manufacturing process, it is impossible to apply the creamed solder onto the periphery of the embossment 11 of the mask for soldering 9 by using the squeegee 10 in the state shown in FIG. 10, so that the chip component 3 can be mounted only in a region away from the embossment 11, resulting in a low integration degree.

(2) When the high-frequency integrated circuit device is mounted as a surface mounted component on the substrate of equipment, the low-melting-point soldering material 6 is melted during the process of solder reflow, so that the chip component shifts in position, which may change high-frequency characteristics associated with a high-frequency signal.

(3) Although a filter circuit used as a drain bias circuit should have low resistance to provide an excellent characteristic, the integration degree is lowered if low resistance is to be provided by using a wiring pattern with a large line width, since the electric resistivity of an interconnect conductor on the ceramic substrate is of the order of 10 mΩ/□.

(4) In general, a shield case should be used to tightly close the high-frequency integrated circuit device, which complicates the manufacturing process.

SUMMARY OF THE INVENTION

It is therefore an object of the present invention to provide a high-frequency integrated circuit device exhibiting a high degree of integration and low thermal resistance, which can be manufactured by a simple process and mounted easily on the substrate of equipment by solder reflow, and a method for the manufacture thereof.

The high-frequency integrated circuit device according to the present invention has a plurality of circuit components including at least one active component for a high-frequency signal and a plurality of passive components, the above high-frequency integrated circuit device comprising: a multilayer structure consisting of a plurality of substrates composed of a dielectric material, wherein the above circuit components can be distributed in an uppermost layer corresponding to a region over a top face of the uppermost substrate, in at least one middle layer corresponding to a region lying between the substrates, in a lowermost layer corresponding to a region over a back face of the lowermost substrate, and in a side layer corresponding to a region over side faces of the above respective substrates; a cavity formed by partially removing some of the substrates of the above multilayer structure; and a semiconductor chip mounted on a bottom face of the above cavity and having the above active component, the circuit components other than the above active component being distributed in the individual layers of the above multilayer structure.

With the arrangement, the number of the substrates underlying the semiconductor chip provided with the active component generating a large amount of heat becomes smaller than the total number of the substrates composing the whole multilayer structure, so that the ability to dissipate heat generated from the active component is improved. Consequently, even when low-cost versatile substrates such as alumina substrates are used, an excellent heat dissipating ability is retained so that the high-frequency integrated circuit device can actually be used in a high-frequency band employed in mobile communication such as a portable telephone.

The above high-frequency integrated circuit may have the following preferred arrangements.

In the high-frequency integrated circuit device, the above cavity may be formed by partially removing each of the substrates except the lowermost one of the above multilayer structure and the above semiconductor chip may be mounted on a region of a top face of the above lowermost substrate exposed in the above cavity and forming a bottom face of the cavity.

With the arrangement, only one substrate underlies the semiconductor chip, so that the ability to dissipate heat generated from the active component is improved.

In the high-frequency integrated circuit device, there can be further provided a member for heat radiation provided on a region of the back face of the lowermost substrate in the above multilayer structure located underneath the above semiconductor chip.

In that case, there can be further provided a through hole formed in the substrate underlying the cavity of the above multilayer structure, the above through hole extending between a region in which the above semiconductor chip is formed and a region in which the above member for heat radiation is formed and a heat conductive member filled in the above through hole.

With the arrangement, the heat dissipating ability is further improved.

By composing each of the above substrates in the above multilayer structure of at least one of aluminum oxide and aluminum nitride, the thermal conductivity of each of the substrates can be increased, while the heat dissipating effect is promoted.

By composing each of the substrates in the above multilayer structure of polycrystal phenylene oxide (PPO), the transmission loss of a high-frequency signal can be reduced.

Of the above substrates in the above multilayer structure, the one underlying the above cavity is composed of at least one of aluminum oxide and aluminum nitride and each of the substrates except the one underlying the above cavity in the above multilayer structure is composed of a glass ceramic, so that the transmission loss of the high-frequency signal is reduced while an excellent heat dissipating ability is retained.

In the high-frequency integrated circuit device, the above circuit components may include a bias circuit having a filter circuit and a high-frequency matching circuit, the above filter circuit and the above high-frequency matching circuit may be distributed in discrete ones of the layers of the above multilayer structure, and a fundamental frequency of the above high-frequency integrated circuit device may be 800 MHz or higher.

With the arrangement, it becomes possible to reduce the volume of the multilayer structure by disposing the filter circuit and the high-frequency matching circuit in three dimensions, while holding the transmission loss in the filter circuit to about 1 dB or lower.

In the high-frequency integrated circuit device, at least one step portion may be formed in the cavity of the above multilayer structure so as to provide a mezzanine face higher in level than the above bottom face of the cavity, the above circuit components may include an interconnect layer formed on the above mezzanine face, and the semiconductor chip on the bottom face of the above cavity may be connected to the above interconnect layer by means of bonding wires.

With the arrangement, it becomes possible to perform wire bonding between the semiconductor chip and the interconnect layer provided on the mezzanine face, which are flush with each other.

By holding respective highest portions of the above bonding wires lower in level than the top face of the uppermost substrate of the above multilayer structure, the whole semiconductor chip including the wires can be contained in the cavity.

By mounting the above semiconductor chip by flip-chip bonding on the substrate forming the bottom face of the above cavity with a face of the semiconductor chip provided with the above active component facing the bottom face of the above cavity, the integration degree can be increased, while the number of process steps can be reduced.

By constructing the high-frequency integrated circuit device such that a region containing the above semiconductor chip of the cavity of the above multilayer structure is hermetically sealed with a potting resin, a planarized surface with no embossment can be provided.

In the high-frequency integrated circuit device, the above circuit components may include a high-frequency matching circuit composed of a microstrip line and a chip component and an interconnect layer, the above high-frequency matching circuit and the above interconnect layer being disposed in the uppermost layer of the above multilayer structure, and the above interconnect layer except for a portion to be soldered and the above high-frequency matching circuit including the above chip component except for the microstrip line for impedance matching may be selectively coated with a coating material composed of either one of a resin-based material and a glass-based material.

With the arrangement, the interconnect layer and the surface of the chip component are protected and, even when the high-frequency integrated circuit device is mounted on the substrate of equipment by solder reflow, the chip component incurs no displacement resulting from the melting of the solder.

In the high-frequency integrated circuit device, the uppermost layer of the above multilayer structure may be coated with a coating material composed of either one of a resin-based material and a glass-based material and having a thickness sufficient to prevent other components from protruding from a planarized top face of the above coating material.

With the arrangement, the chip component is protected, while the entire surface of the high-frequency integrated circuit device can be planarized.

In the high-frequency integrated circuit device, the planarized top face of the above coating material may be coated with an electrically conductive material.

With the arrangement, the shielding effect is achieved so that the shield case becomes unnecessary.

By constructing the high-frequency integrated circuit device such that the above circuit components include a bias circuit having a filter circuit and that a width of a microstrip line of the above filter circuit is 200 µm or more, the interconnection resistance can be reduced to 0.4 Ω or less.

In the high-frequency integrated circuit device, the cavity of the above multilayer structure may be formed by partially removing the lowermost one of the above plurality of substrates composing the above multilayer structure, the above semiconductor chip may be mounted by flip-chip bonding on the bottom face of the above cavity with a front face of the semiconductor chip facing the bottom face of the above cavity, and a back face of the above semiconductor chip can be brought into contact with a front face of equipment on which the high-frequency integrated circuit device is to be mounted.

With the arrangement, when the high-frequency integrated circuit device is mounted on the substrate of equipment, the semiconductor chip can dissipate heat directly to the substrate of the equipment.

A first method of manufacturing a high-frequency integrated circuit device comprises the steps of: stacking in layers a plurality of substrates composed of a dielectric material to form a multilayer structure wherein circuit components to be subsequently formed are distributed in an uppermost layer corresponding to a region over a top face of the uppermost substrate, in at least one middle layer corresponding to a region lying between the substrates, in an lowermost layer corresponding to a region over a back face of the lowermost substrate, and in a side layer corresponding to a region over side faces of the above respective substrates, partially removing some of the substrates of the above multilayer structure to form a cavity having at least one step portion such that a bottom face and a mezzanine face higher than the above bottom face exist in the cavity, and forming interconnect electrodes and the circuit components on the above mezzanine face, in the uppermost layer, and in the middle layer; die bonding a semiconductor chip having electrodes for connection with external equipment in the bottom face of the above cavity by using a soldering material having a melting point equal to or higher than 215° C.; connecting the electrodes on the above semiconductor chip to the interconnect electrodes on the mezzanine face of the above cavity by means of wires; coating, by using a mask for soldering, a specified region of an interconnect layer in the uppermost layer of the above multilayer structure with a creamed solder having a melting point equal to or lower than a melting point of the above soldering material used for die bonding and mounting a chip component on the region coated with the above creamed solder such that the above creamed solder is caused to reflow for soldering.

By the method, the chip component can be soldered at a temperature lower than the temperature at which the semiconductor chip has been soldered previously, so that the semiconductor chip previously soldered incurs no displacement.

A second method of manufacturing a high-frequency integrated circuit device comprises the steps of: stacking in layers a plurality of substrates composed of a dielectric material to form a multilayer structure wherein circuit components to be subsequently formed are distributed in an uppermost layer corresponding to a region over a top face of the uppermost substrate, in at least one middle layer corresponding to a region lying between the substrates, in an lowermost layer corresponding to a region over a back face of the lowermost substrate, and in a side layer corresponding to a region over side faces of the above respective substrates, partially removing some of the substrates of the above multilayer structure to form a cavity having at least one step portion such that a bottom face and a mezzanine face higher than the above bottom face exist in the cavity, and forming interconnect electrodes and the circuit components on the above mezzanine face, in the uppermost layer, and in the middle layer; coating, by using a mask for soldering, a specified region of an interconnect layer in the uppermost layer of the above multilayer structure with a creamed solder; mounting a chip component on the region coated with the above creamed solder such that the above creamed solder is caused to reflow for soldering; die bonding a semiconductor chip having electrodes for connection with external equipment onto the bottom face of the above cavity with the use of a resin-based paste containing boron nitride or silver; and connecting the electrodes of the above semiconductor chip to the interconnect electrodes on the mezzanine face of the above cavity by means of wires.

By the method, the semiconductor chip is bonded at a low temperature with a paste subsequently to the chip component, so that a thermal stress given to the semiconductor chip is minimized, while the chip component previously soldered incurs no displacement.

DETAILED DESCRIPTION OF THE INVENTION (First Embodiment)

Figure 1:
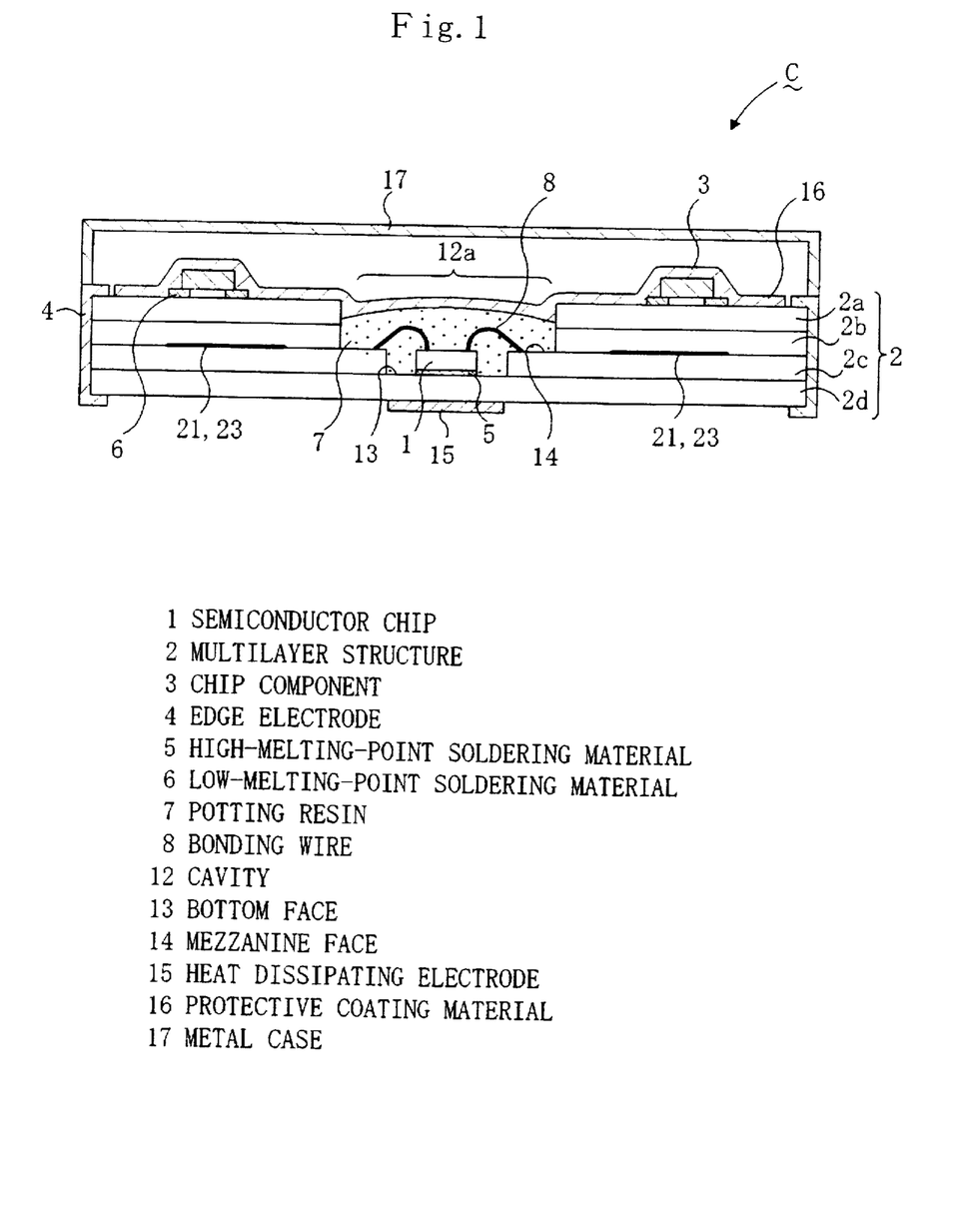
FIG. 1 is a cross-sectional view of a high-frequency integrated circuit device according to a first embodiment.
Figure 11:
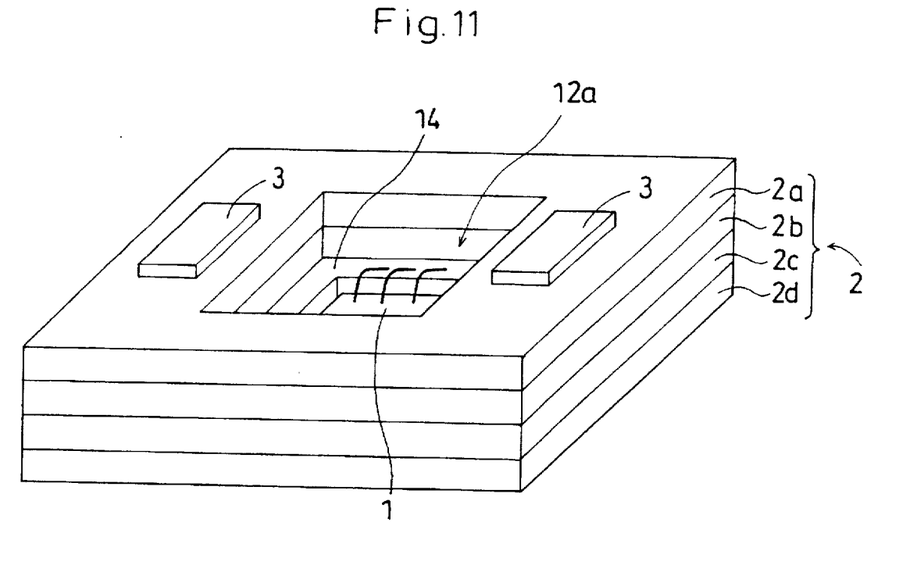
FIG. 11 is a perspective view showing the three-dimensional arrangement of the high-frequency integrated circuit device according to each of the embodiments.

FIG. 1 is a cross-sectional view of a high-frequency integrated circuit device C according to a first embodiment. FIG. 11 is a perspective view showing the three-dimensional arrangement of a multilayer structure in the high-frequency integrated circuit C.

As shown in FIG. 1, there is provided a multilayer structure 2 consisting of first to fourth substrates 2a to 2d composed of a ceramic material and stacked in layers. The central portion of the above multilayer structure 2 is provided with a rectangular cavity 12a formed by removing the central portions of the first to third substrates 2a to 2c except the lowermost fourth substrate 2d.

It is assumed here that, in the following description, the uppermost layer of the multilayer structure 2 corresponds to a region over the top face of the uppermost first substrate 2a, the lowermost layer corresponds to a region over the back face of the lowermost fourth ceramic substrate 2d, middle layers correspond to regions lying between the individual substrates 2a to 2d, and a side layer corresponds to a region over outer side faces of the individual substrates 2a to 2d. If the multilayer structure 2 is inverted, the order in which the individual substrates 2a to 2d are stacked as shown in FIG. 1 is reversed but, in that case also, the opening side of the cavity 12a is assumed to be the upper side and the bottom side of the cavity 12a is assumed to be the lower side for the sake of convenience.

The above cavity 12a is formed by removing the respective central regions of the first and second substrates 2a and 2b so that the resulting hollow portions have the same configuration and by removing the central region of the third substrate 2c so that the resulting hollow portion is narrower than the hollow portions formed in the first and second substrates 2a and 2b and that a mezzanine face 14 is included in the top face of the third substrate 2c. A semiconductor chip 1 such as a transistor is bonded onto the fourth substrate 2d forming the bottom face 13 of the cavity 12a with the use of a high-melting-point soldering material 5. Electrodes (not shown) on the semiconductor chip 1 are connected to interconnect electrodes (not shown) formed on the mezzanine face 14 via bonding wires 8. The semiconductor chip 1, the bonding wires 8, and the like are hermetically sealed with a potting resin 7. A chip component 3 such as a chip capacitor is bonded onto the uppermost first substrate 2a positioned around the cavity 12a of the multilayer structure 2 with the use of a low-melting-point soldering material 6. There are also provided: an edge electrode 4 formed along the outer side faces of the individual substrates 2a to 2d of the multilayer structure; a heat dissipating electrode 15 formed by plating on the back face of the fourth substrate 2d of the multilayer structure 2; a protective coating material 16 covering the top face of the uppermost first substrate 2a (except for the land portion for solder bonding and the portion corresponding to a microstrip line for matching adjustment) of the multilayer structure 2 and substantially the entire top face of the potting resin 7; and a metal case 17 attached to the upper end face of the edge electrode 4 and covering the multilayer structure 2 while maintaining a given spacing with the protective coating material 16.

Figure 2:
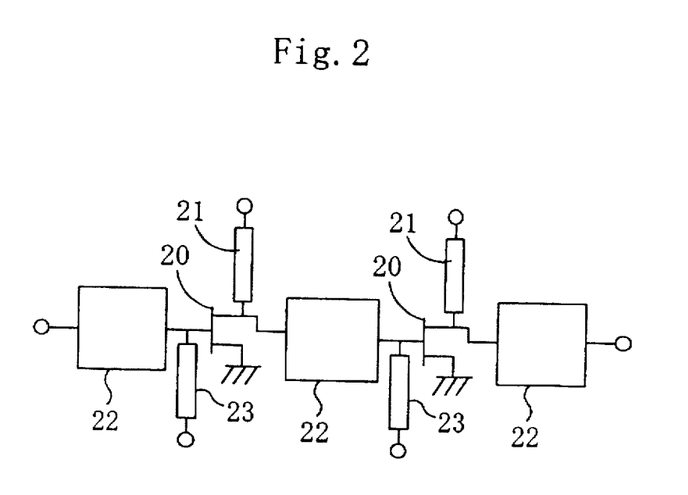
FIG. 2 schematically shows an arrangement of an equivalent circuit to an electric circuit in the high-frequency integrated circuit device according to the first embodiment.

FIG. 2 is a circuit diagram schematically showing an equivalent circuit to the high-frequency integrated circuit device C according to the first embodiment. As shown in the drawing, the high-frequency integrated circuit comprises: two field-effect transistors (FETs) 20 functioning as first and second amplifiers, respectively; drain bias circuits 21 for the respective FETs 20; three high-frequency matching circuits 22 functioning as an input matching circuit, an interstage matching circuit, and an output matching circuit, respectively; and gate bias circuits 23 for the respective FETs 20.

Each of the FETs 20 is provided in the semiconductor chip 1 shown in FIG. 1. In the present embodiment, the FETs 20 are formed on a semi-insulating GaAs substrate. The high-frequency matching circuit 22 consists of the above chip component 3 and a microstrip line (interconnect layer having its impedance matched with a characteristic impedance) formed on the first substrate 2a. Filter circuits composing the drain bias circuits 21 (collector bias circuits in the case of using bipolar transistors) and the gate bias circuits 23 may be provided in the uppermost layer or the middle layer of the multilayer structure 2. In the present embodiment, the filter circuits are provided between the second substrate 2b and the third substrate 2c.

Thus, by providing the filter circuits and the high-frequency matching circuits in discrete layers, the area occupied by the mounted circuit components does not become excessively large even when a wiring pattern with a large line width of 200 μm or more is used. Consequently, not only the line width but also integration degree can be increased, thereby achieving an interconnection resistance of 0.4 Ω or lower.

Although the drain bias circuits 21 are designed to serve as filters for a high-frequency wave, the characteristics of the filters are determined by the length of a transmission line relative to the wavelength of a high-frequency wave to be propagated. For example, if the length of the transmission line is set to ¼ of the wavelength of a fundamental frequency and the termination is short-circuited with respect to a high-frequency signal, the drain bias circuit 21 has an infinite impedance with respect to the fundamental frequency, while having an impedance in a short-circuited state with respect to double the fundamental frequency. Hence, in the case of composing such filters, when a fundamental wave is set at a low wavelength, the length of the transmission line is increased, which increases the high-frequency integrated circuit device C in size and reduces the integration degree thereof. In the case of using an alumina substrate with a relative dielectric constant of 10, the length of a transmission line equal to ¼ of a wavelength for a 800 MHz signal actually becomes about 30 mm. As a result, if the width of the transmission line and the volume of the integrated circuit is to be limited to 200 µm or more and to 0.5 cc or less, respectively, the minimum fundamental frequency is approximately 800 MHz. Accordingly, by setting the operating frequency of the high-frequency integrated circuit at 800 MHz or more, a loss as a filter can be reduced to a low value of 1 dB or less without excessively increasing the area occupied by the mounted circuit components.

In the arrangement of the present embodiment, the respective highest portions of the bonding wires 8 are sufficiently lower in level than the uppermost layer of the multilayer structure 2 and the potting resin 7 entirely covering the semiconductor chip 1 and the bonding wires 8 is lower in level than the uppermost layer of the multilayer structure 2. With the arrangement, the entire surface is substantially planarized with no projection formed in the multilayer structure 2. Moreover, since the entire surface is substantially planarized, the creamed solder as the low-melting-point soldering material 6 for soldering the chip component 3 can be applied with the use of a flat mask for soldering, so that the chip component 3 can be mounted even in the vicinity of the semiconductor chip 1. Consequently, the integration degree is increased and the high-frequency integrated circuit can be reduced in size. As a result, the volume of the high-frequency integrated circuit device becomes 0.2 cc or less, while the volume of the conventional high-frequency integrated circuit device having equal numbers of active and passive components and using the single-layer substrate is 0.4 cc, which indicates that the overall volume is reduced to ½ or less.

Next, a description will be given to the manufacturing process for implementing the structure of the high-frequency integrated circuit device C according to the above first embodiment.

Initially, the multilayer structure 2 having the cavity 12a is formed and then the semiconductor chip 1 is die bonded to the bottom face 13 of the cavity 12a formed in the multilayer structure 2 with the use of a soldering material with a melting point of 215° C. or higher. Between the uppermost layer and middle layer of the multilayer structure 2, there is formed an interconnect layer for providing interconnection between the foregoing various circuits. On the back face of the lowermost substrate 2d of the multilayer structure 2, the heat dissipating electrode 15 is formed by plating. For the heat dissipating electrode 15, a soldering material containing an Au-Sn alloy as the main component with a lowest melting point in the vicinity of 215° C. is used.

Next, wire bonding is performed by providing the wires 8 connecting the semiconductor chip 1 to the interconnect layer formed on the mezzanine face 14, followed by the hermetical sealing of the semiconductor chip 1 and the wires 8 with the potting resin 7. Then, the creamed solder composing the low-melting-point soldering material 6 having a melting point of 215° C. or lower is applied by screen printing onto the first substrate 2a. After the chip component 3 is mounted on the low-melting-point soldering material 6, the low-melting-point soldering material 6 is caused to reflow, thereby bonding the chip component 3. Subsequently, the protective coating material 16 is applied onto a region over the first substrate 2a, chip component 3, potting resin 7, and the like, followed by the attachment of the metal case 17 in the form of a cap.

According to the foregoing process, the low-melting-point material 6 has not been formed when wire bonding is performed, so that such problems as displacement of the chip component 3 does not arise even when the temperature is raised to approximately 200° C. Consequently, the wire exhibits a satisfactory tensile strength with no application of an ultrasonic wave, while a pitch on the order of 100 µm or less is achieved between the wire bonds.

On the other hand, there can be performed a second manufacturing process for implementing the structure according to the first embodiment of the present invention, which will be described below. First, the multilayer structure 2 is prepared in which the various circuits and interconnect layer described above are formed in the uppermost layer and in the middle layer and the heat dissipating electrode 15 is formed by plating in the lowermost layer (on the back face of the lowermost fourth substrate 2d). Next, the creamed solder composing the low-melting-point soldering material 6 is applied onto a surface of the first substrate 2a by screen printing, followed by the mounting of the chip component 3 on the low-melting-point soldering material 6. The low-melting-point soldering material 6 is then caused to reflow, thereby bonding the chip component 3. Subsequently, the semiconductor chip 1 is die bonded onto the bottom face 13 of the cavity 12a with the use of a resin-based paste containing boron nitride or silver and having a thermal conductivity of $2.5 \times 10^{-3}$ cal/cm·sec.°C. or higher. Thereafter, wire bonding, hermetical sealing with the potting resin 7, the application of the protective coating material 16, and the attachment of the metal case 17 in the form of a cap are sequentially performed, similarly to the above first manufacturing process.

In the foregoing second manufacturing process, a thermal resistance sufficiently low for use in a power amplifier of 500 mW or more can be achieved by reducing the thickness of the paste material between the semiconductor chip 1 and the bottom face 13 of the cavity 12a to 5 µm or less. In other words, a minimum thermal stress is given to the semiconductor chip 1 according to the second manufacturing process.

In the high-frequency integrated circuit device C according to the first embodiment, the cavity 12a is formed in the multilayer structure 2 so that the semiconductor chip 1 is mounted on the bottom face 13 of the cavity 12a. Accordingly, when the high-frequency integrated circuit device of hybrid type according to the present embodiment is mounted on the substrate of equipment, the thickness of each of the substrates composing the multilayer structure 2 lying between the semiconductor chip 1 and the equipment is reduced. Even when an alumina substrate is used, for example, an excellent heat dissipating ability can be obtained since the thermal resistance is reduced accordingly by a reduction in the thickness of the layer between the semiconductor chip and the substrate of the equipment.

In the present embodiment, in particular, only the fourth substrate 2d underlies the cavity 12a shown in FIG. 1 and the thickness of the fourth substrate 2d accounts for ¼ of the total thickness of the multilayer structure 2. Consequently, the thermal resistance of the multilayer structure 2 can also be reduced to ¼, so that a power amplifying circuit consuming high power of 500 mW or more can be formed.

As shown in FIG. 1, since the heat dissipating electrode 15 is formed on the back face of the fourth substrate 2d located immediately below the semiconductor chip 1 in the present embodiment, heat generated from the semiconductor chip 1 can be dissipated with a high efficiency to the substrate of the equipment on which the high-frequency integrated circuit device is mounted. In addition, since the heat dissipating electrode 15 is plated with a solder or the like for the convenience of soldering, the heat dissipating ability is further improved.

Although each of the substrates 2a to 2d composing the multilayer structure 2 is composed of alumina in the present embodiment, the present invention is not limited thereto. For example, the substrates 2a to 2d may be composed of aluminum nitride. When the substrates 2a to 2d are composed of aluminum nitride, the thermal resistance of the multilayer structure 2 can be reduced to ⅑ of that of the multilayer structure 2 composed of alumina, since aluminum nitride has a high thermal conductivity of 150 mW/mK which is about nine times the thermal conductivity of alumina, resulting in a structure sufficiently applicable to a high-power device.

In the present embodiment, moreover, the chip component 3 soldered onto the uppermost first substrate 2a of the multilayer structure 2 is covered with the protective coating material 16 composed of a resin-based material or a glass-based material. With the arrangement, a loss of a high-frequency signal can be reduced by utilizing the characteristic of a reduced high-frequency loss of the resin-based material or glass-based material. Furthermore, since substantially the entire surface of the substrate is coated with the protective coating material 16, the low-melting-point soldering material 6 used to bond the chip component 3 is neither melted nor displaced during the process of solder reflow for mounting the high-frequency integrated circuit device C of hybrid type on the substrate of equipment, which prevents the high-frequency characteristics from changing.

Additionally, since the metal case 17 serving as a package is attached to the multilayer structure 2 in the present embodiment, the shielding of the FETs 20 in the high-frequency integrated circuit device C from a radio wave can reliably be performed.

Although the multilayer structure 2 in the present embodiment has the three-dimensional arrangement shown in FIG. 11, the present invention is not limited thereto. The multilayer structure 2 may have other three-dimensional arrangements as shown in the following variations.

Figure 12:
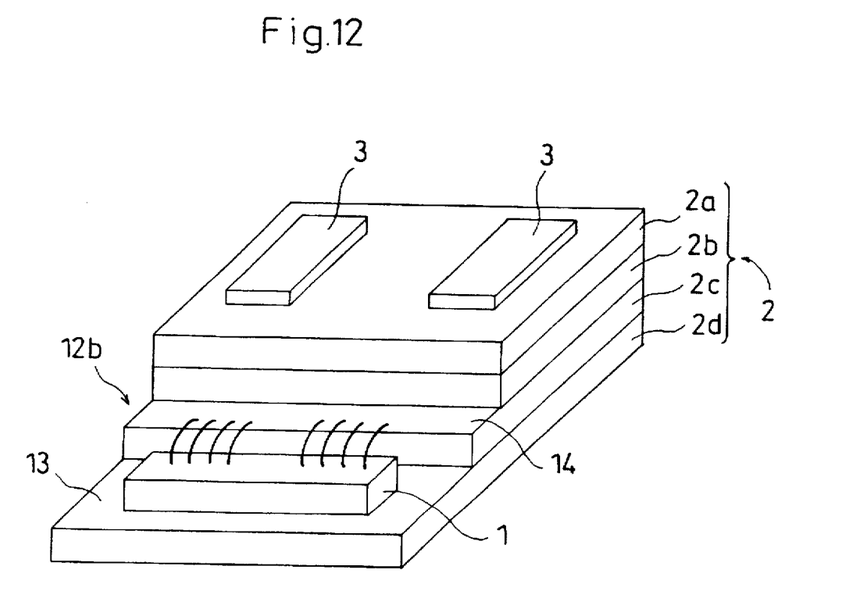
FIG. 12 is a perspective view showing the three-dimensional arrangement of a first variation of the high-frequency integrated circuit device according to each of the embodiments.

As shown in FIG. 12 for illustrating the first variation, the edge portion of the multilayer structure along one edge of each of the first to third substrates 2a to 2c may be removed to form a cavity 12b, so that the semiconductor chip 1 is mounted on the fourth substrate 2d forming the bottom face 13 of the cavity 12b. By providing the third substrate 2c wider than the first and second substrates 2a and 2b with the mezzanine face 14, wire bonding can be performed between the semiconductor chip 1 and the interconnect layer formed on the mezzanine face, similarly to the case of using the arrangement shown in FIG. 11.

Figure 13:
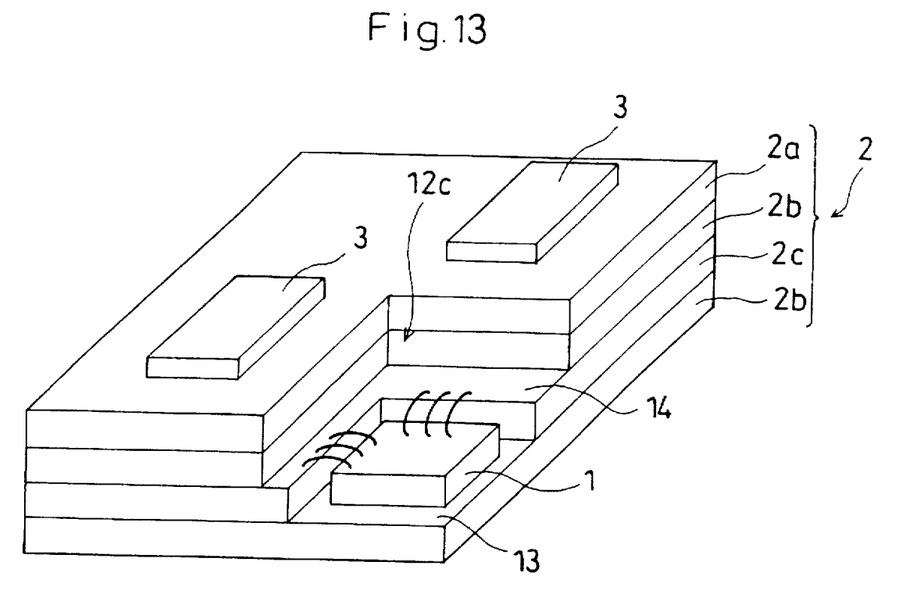
FIG. 13 is a perspective view showing the three-dimensional arrangement of a second variation of the high-frequency integrated circuit device according to each of the embodiments.

As shown in FIG. 13 for illustrating the second variation, a region in the vicinity of one corner of each of the first to third substrates 2a to 2c may be removed to form a cavity 12c so that the semiconductor chip 1 is mounted on the fourth substrate 2d forming the bottom face 13 of the cavity 12c.

Figure 14:
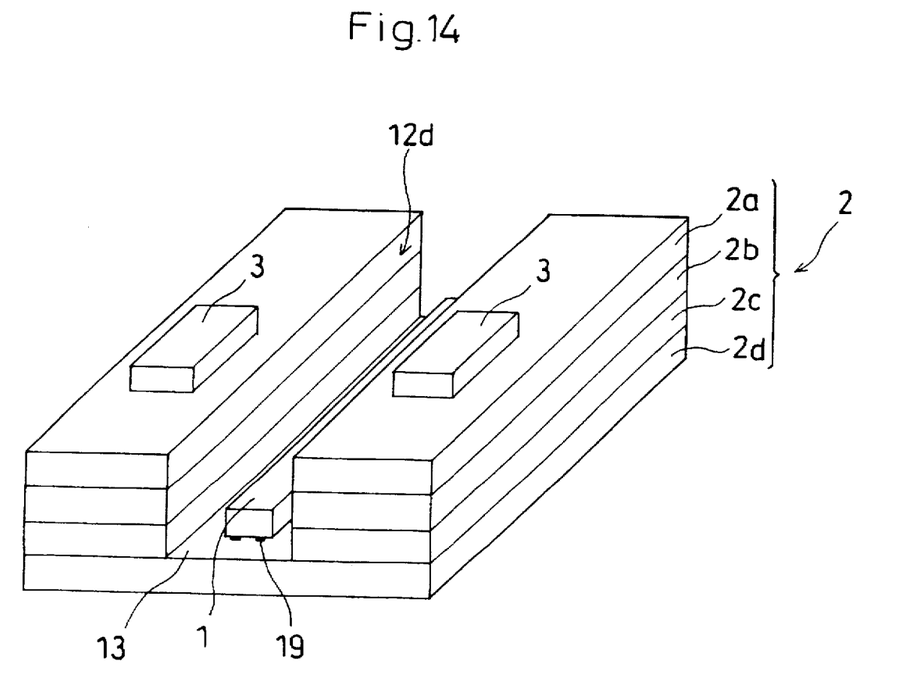
FIG. 14 is a perspective view showing the three-dimensional arrangement of a third variation of the high-frequency integrated circuit device according to each of the embodiments.

As shown in FIG. 14 for illustrating the third variation, the central region of each of the first to third substrates 2a to 2c may be removed along the length thereof so that the semiconductor chip 1 is mounted on the fourth substrate 2d forming the bottom face 13 of a cavity 12d. In the third variation, the semiconductor chip 1 is mounted on the fourth substrate 2d with intervention of bumps 19 by flip-chip bonding without forming a mezzanine face.

(Second Embodiment)

Next, a high-frequency integrated circuit device D according to a second embodiment will be described with reference to FIG. 3. In the present embodiment also, the multilayer structure 2 has the same three-dimensional arrangement as shown in FIG. 11 illustrating the first embodiment. In the present embodiment, however, the multilayer structure 2 may also have any one of the arrangements shown in FIGS. 12 to 14.

Figure 3:
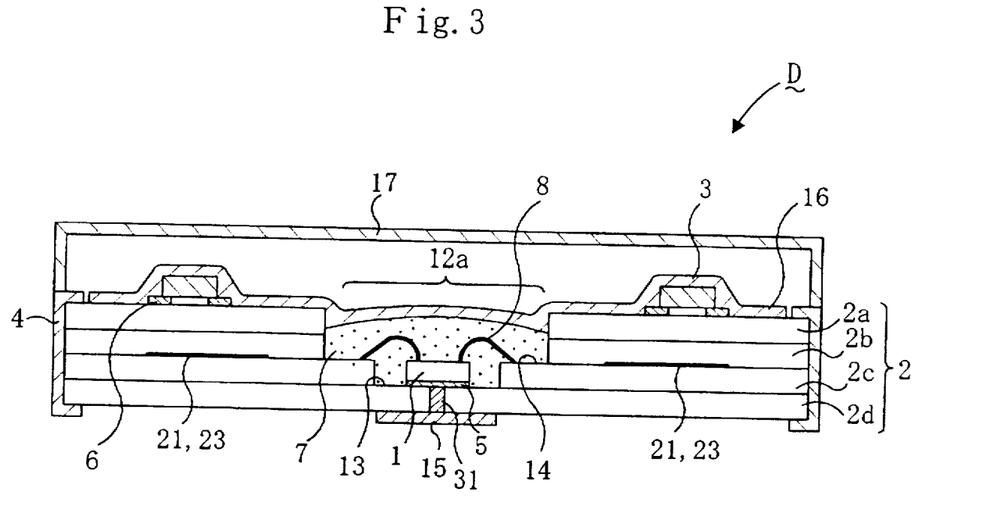
FIG. 3 is a cross-sectional view of a high-frequency integrate circuit device according to a second embodiment.

The arrangement of the high-frequency integrated circuit device D according to the present embodiment is basically the same as the arrangement shown in FIG. 1 illustrating the first embodiment except that, in the arrangement shown in FIG. 3, each of the substrates 2a to 2d composing the multilayer structure 2 is composed of polycrystal phenylene oxide (PPO) giving a low transmission loss to a high-frequency wave. However, since PPO is lower in thermal conductivity than ceramic, a through hole 31 extending through the fourth substrate 2d is formed between the region in which the semiconductor chip 1 is mounted and the region in which the heat dissipating electrode 15 is formed, so that a thermal conductor is filled in the through hole 31. With the arrangement, the PPO substrate exerts an increased heat dissipating effect, which enables the application of the high-frequency integrated circuit device D to a high-output power amplifier.

There may be cases where the semiconductor chip 1 is mounted in a package or chip carrier.

(Third Embodiment)

Next, a high-frequency integrated circuit device E according to a third embodiment will be described with reference to FIG. 4. In the present embodiment also, the multilayer structure 2 has the same three-dimensional arrangement as shown in FIG. 11 illustrating the first embodiment. In the present embodiment, the multilayer structure 2 may also have any one of the arrangements shown in FIGS. 12 to 14.

Figure 4:
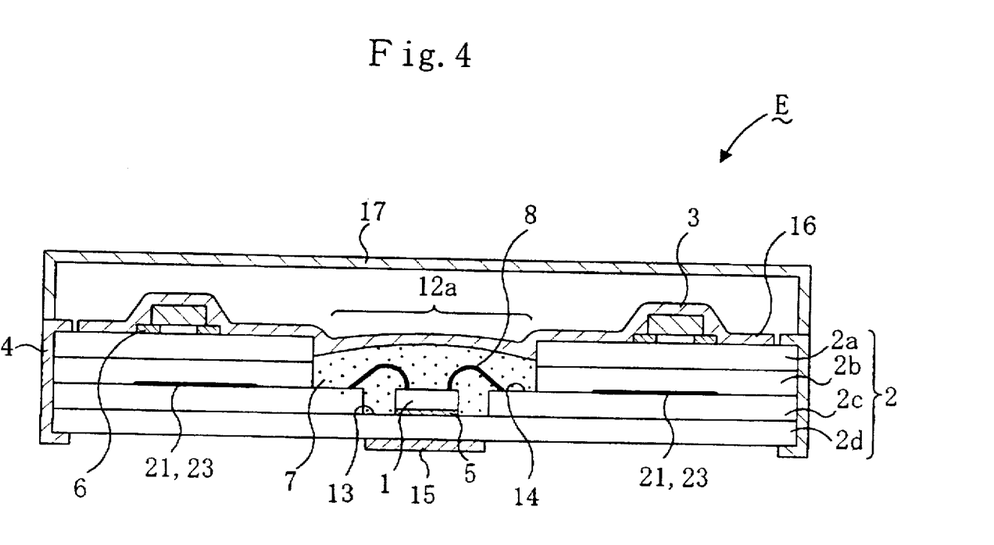
FIG. 4 is a cross-sectional view of a high-frequency integrated circuit device according to a third embodiment.

The arrangement of the high-frequency integrated circuit device E according to the present embodiment is basically the same as that of the first embodiment shown in FIG. 1 except that, in the arrangement shown in FIG. 4, the fourth substrate 2d of the multilayer structure 2 with the semiconductor chip 1 mounted thereon is composed of a ceramic material cofired at high temperature such as aluminum oxide or aluminum nitride, while the first to third substrate 2a to 2c are composed of a glass ceramic material sintered at low temperature. With the arrangement, a sufficient amount of heat radiation can be obtained from the semiconductor chip 1 generating a large amount of heat, while a cost reduction is achieved by using a low-cost glass ceramic to compose the first to third substrates 2a to 2c on which only passive components are mounted.

(Fourth Embodiment)

Below, a high-frequency integrated circuit device F according to a fourth embodiment will be described with reference to FIG. 5. In the present embodiment also, the multilayer structure 2 has the same arrangement as shown in FIG. 11, illustrating the above first embodiment. In the present embodiment, however, the multilayer structure 2 may also have any one of the arrangements shown in FIGS. 12 to 14.

Figure 5:
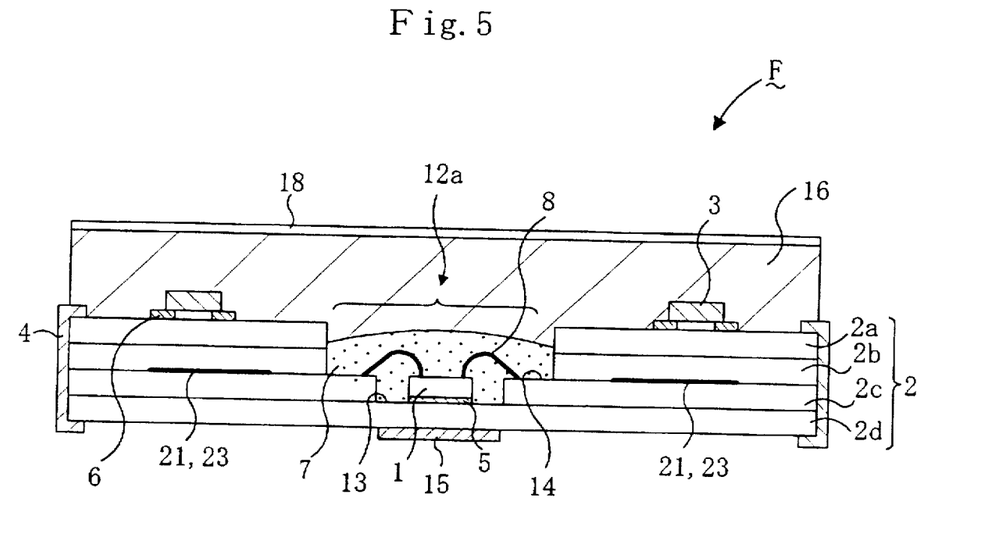
FIG. 5 is a cross-sectional view of a high-frequency integrated circuit device according to a fourth embodiment.

The arrangement of the high-frequency integrated circuit device F is basically the same as that of the first embodiment shown in FIG. 1 except that, in the arrangement shown in FIG. 5, the thick protective coating material 16 is formed over the entire surface of the multilayer structure and a metal coating film 18 is further formed on the protective coating material 16. The protective coating material 16 has a sufficient thickness of 0.5 mm or more to planarize the surface thereof. The metal coating film 18 overlying the protective coating material 16 functions as a metal case for shielding the FETs 20 and the like from a radio wave, so that the step of attaching the metal case as shown in FIG. 1 can be omitted advantageously.

(Fifth Embodiment)

Figure 6:
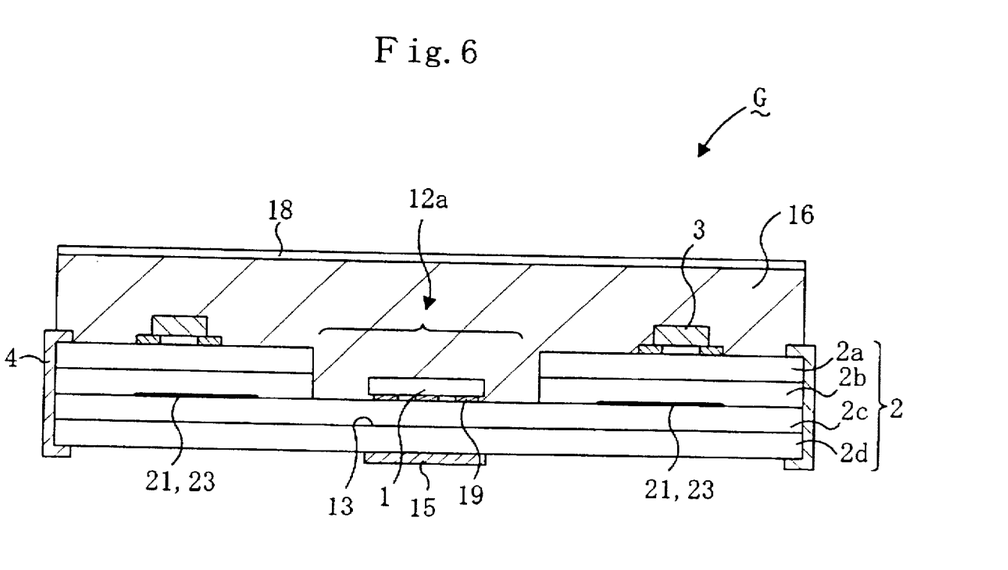
FIG. 6 is a cross-sectional view of a high-frequency integrated circuit device according to a fifth embodiment.

Below, a high-frequency integrated circuit device G according to the fifth embodiment will be described with reference to FIG. 6. In the present embodiment also, the cavity 12a is formed in the same position of the multilayer structure 2 as in the first embodiment shown in FIG. 11. In the present embodiment, however, the cavity 12a is formed by removing only the first and second substrates 2a and 2b so that the third and fourth substrates 2c and 2d underlie the cavity 12a. In the present embodiment, the multilayer structure 2 may also have any one of the arrangements shown in FIGS. 12 to 14.

The arrangement of the high-frequency integrated circuit device G is different from that of the above first embodiment in that the semiconductor chip 1 is mounted on the fourth substrate 2d with intervention of bumps 19 by flip-chip bonding. Consequently, the mezzanine face for bonding wires becomes unnecessary, while the cavity 12a has single-stage concave topography and the two substrates are left underneath the cavity, unlike the above first embodiment. As for the other components, they are the same as those used in the above fourth embodiment.

With the arrangement of the present embodiment, the step of wire bonding can be omitted, while the area occupied by the cavity 12a is reduced, so that integration degree becomes higher than in the case of performing wire bonding.

With the arrangement, moreover, it is not necessary to use a potting resin so that a loss due to the potting resin is eliminated at a frequency equal to or higher than 1.5 GHz. Furthermore, since no wire is used, a gain reduction due to the inductance of a source wire can be prevented. In short, the electric characteristic of the high-frequency integrated circuit device can be improved.

If the area occupied by the bumps 19 for connection is increased to 15% or more of the area occupied by the semiconductor chip 1 in order to connect the face formed with the FETs of the semiconductor chip 1 to the electrodes on the bottom face 13 of the cavity 12, the thermal resistance becomes smaller by the thickness of the semiconductor chip 1 than in the case of adopting the wire bonding method, so that an excellent heat dissipating ability is obtained.

(Sixth Embodiment)

Figure 7:
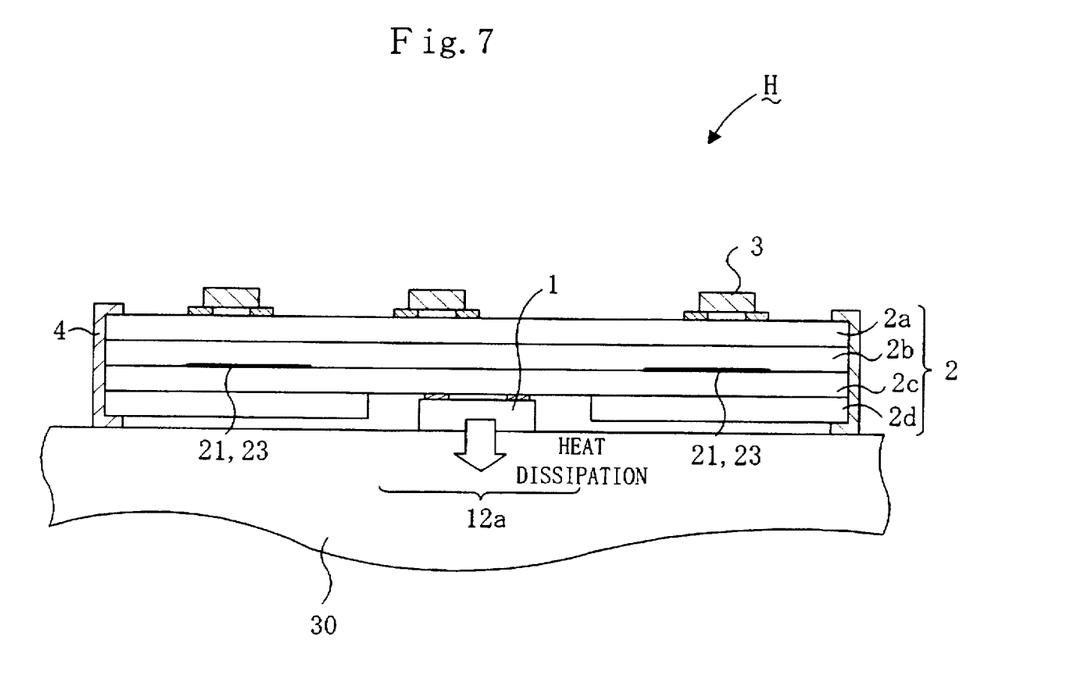
FIG. 7 is a cross-sectional view of a high-frequency integrated circuit device according to a sixth embodiment.

Next, a high-frequency integrated circuit device H according to a sixth embodiment will be described with reference to FIG. 7. In the present embodiment, the cavity 12a is formed by removing only the lowermost fourth substrate 2d. In the present embodiment also, the position in which the cavity is formed may be changed according to the arrangements shown in FIGS. 12 to 14.

The arrangement of the high-frequency integrated circuit device H of the present embodiment is characterized in that mounting is conducted by flip-chip bonding similarly to the above fifth embodiment and that the high-frequency integrated circuit device H is mounted on equipment with the back face of the semiconductor chip 1 kept in contact with a substrate 30 of the equipment. To keep the back face of the semiconductor chip 1 in contact with the substrate 30 of the equipment, the lowermost position of the multilayer structure 2 and the back face of the semiconductor chip 1 are made flush with each other. In addition, the chip component 3 is mounted on the uppermost first substrate 2a.

In the present embodiment, since the cavity 12a is formed by removing only the fourth substrate 2d, the first to third substrates 2a to 2c are left over the cavity 12a, which further increases integration degree. Moreover, since the high-frequency integrated circuit device H is mounted on the equipment with the back face of the semiconductor chip 1 kept in contact with the substrate 30 of the equipment, the semiconductor chip 1 can dissipate heat directly to the substrate 30 of the equipment, thus exhibiting an excellent heat dissipating ability even when each of the substrates 2a to 2d composing the multilayer structure 2 is composed of a comparatively low-cost versatile ceramic material such as alumina.

We claim:

1. A high-frequency integrated circuit device having a plurality of circuit components including at least one active component for a high-frequency signal and a plurality of passive components, said high-frequency integrated circuit device comprising:

a multilayer structure comprising a plurality of substrates composed of a dielectric material, wherein said circuit components are disposed on an upper surface of an uppermost substrate, in at least one middle layer corresponding to a region lying between the substrates, on a lower surface of a lowermost substrate, and on a side layer formed by side surfaces of said respective substrates;

a cavity formed by removing a part of the substrate of said multilayer structure including said uppermost substrate; and a semiconductor chip mounted on a bottom surface of said cavity, said semiconductor chip comprising said active component, said passive components being distributed in said uppermost substrate and said middle layer of said multilayer structure, wherein said semiconductor chip mounted in said cavity is sealed with a resin, and said upper surface of said uppermost substrate and an upper surface of the resin are substantially flush with one another.

2. A high-frequency integrated circuit device according to claim 1, further comprising:

a member for heat radiation provided on a region of a lower surface of the lowermost substrate in said multilayer structure located underneath said semiconductor chip.

3. A high-frequency integrated circuit device according to claim 2, further comprising:

a through hole formed in the substrate underlying the cavity of said multilayer structure, said through hole extending between a region in which said semiconductor chip is formed and a region in which said member for heat radiation is formed, and a heat conductive member disposed in said through hole.

4. A high-frequency integrated circuit device according to claim 1, wherein each of said substrates in said multilayer structure is composed of at least one of aluminum oxide and aluminum nitride.

5. A high-frequency integrated circuit device according to claim 1, wherein
each of the substrates in said multilayer structure is composed of polycrystal phenylene oxide (PPO).

6. A high-frequency integrated circuit device according to claim 5, further comprising:
a member for heat radiation provided on a region of the lower surface of the lowermost substrate in said multilayer structure located underneath said semiconductor chip;
a through hole formed by selectively removing a portion of the substrate underlying the cavity of said multilayer structure lying between said semiconductor chip and said member for heat radiation; and
a heat conductive member disposed in said through hole.

7. A high-frequency integrated circuit device according to claim 1, wherein
of said substrates in said multilayer structure, the one underlying said cavity is composed of at least one of aluminum oxide and aluminum nitride and
each of the substrates except the one underlying said cavity in said multilayer structure is composed of a glass ceramic.

8. A high-frequency integrated circuit device according to claim 1, wherein
said circuit components include a bias circuit having a filter circuit and a high-frequency matching circuit,
said filter circuit and said high-frequency matching circuit are distributed in discrete ones of the layers of said multilayer structure, and
a fundamental frequency of said high-frequency integrated circuit device is 800 MHz or higher.

9. A high-frequency integrated circuit device according to claim 1, wherein
at least one step portion is formed in the cavity of said multilayer structure so as to provide a mezzanine surface higher in level than said bottom surface of the cavity,
said circuit components include an interconnect layer formed on said mezzanine surface, and
the semiconductor chip on the bottom surface of said cavity is connected to said interconnect layer by means of bonding wires.

10. A high-frequency integrated circuit device according to claim 9, wherein
the respective highest portions of said bonding wires are lower in level than the upper surface of the uppermost substrate of said multilayer structure.

11. A high-frequency integrated circuit device according to claim 1, wherein
said semiconductor chip is mounted by flip-chip bonding on the substrate forming the bottom surface of said cavity with a surface of the semiconductor chip provided with said active component facing the bottom surface of said cavity.

12. A high-frequency integrated circuit device according to claim 1, wherein
said circuit components include a high-frequency matching circuit composed of a microstrip line and a chip component and an interconnect layer, said high-frequency matching circuit and said interconnect layer being disposed in the uppermost layer of said multilayer structure, and
said interconnect layer except for a portion to be soldered and said high-frequency matching circuit including said chip component except for the microstrip line for impedance matching are selectively coated with a coating material composed of either one of a resin-based material and a glass-based material.

13. A high-frequency integrated circuit device according to claim 1, wherein
the uppermost layer of said multilayer structure is coated with a coating material composed of either one of a resin-based material and a glass-based material and having a thickness sufficient to prevent other components from protruding from a planarized top face of said coating material.

14. A high-frequency integrated circuit device according to claim 13, wherein
the planarized top face of said coating material is coated with an electrically conductive material.

15. A high-frequency integrated circuit device according to claim 1, wherein
said circuit components include a bias circuit having a filter circuit and
a width of a microstrip line of said filter circuit is 200 μm or more.

16. A high-frequency integrated circuit device according to claim 15, wherein
said circuit components include a chip component partially composing a high-frequency matching circuit and
said chip component is mounted on the uppermost substrate of said multilayer structure.

17. A high-frequency integrated circuit device having a plurality of circuit components including at least one active component for a high-frequency signal and a plurality of passive components, said high-frequency integrated circuit device comprising:
a multilayer structure comprising a plurality of substrates composed of a dielectric material, wherein said circuit components are disposed on an upper surface of an uppermost substrate, in at least one middle layer corresponding to a region lying between the substrates, on a lower surface of a lowermost substrate, and on a side layer formed by side surfaces of said respective substrates;
a cavity formed by removing a part of the lowermost substrate; and
a semiconductor chip having said active components and mounted by flip-chip bonding on a bottom surface of said cavity with a front face of the semiconductor chip facing the bottom surface of said cavity,
wherein a back face of said semiconductor chip can be brought into contact with equipment on which the high-frequency integrated circuit device is to be mounted, and
said circuit components of said active component is distributed in upper surface of said uppermost substrate and said middle layer of said multilayer structure.

18. A high-frequency integrated circuit device according to claim 1, wherein
a circuit component of an edge electrode is formed at said side layer of said multilayer structure.

19. A high-frequency integrated circuit device according to claim 1, wherein
said circuit component of said passive components disposed on the said upper surface of said uppermost substrate serves as a condenser or a resistance chip.

* * * * *

UNITED STATES PATENT AND TRADEMARK OFFICE
CERTIFICATE OF CORRECTION

PATENT NO. : 5,796,165
DATED : August 18, 1998
INVENTOR(S) : Yoshikawa et al.

It is certified that error appears in the above-identified patent and that said Letters Patent is hereby corrected as shown below:

In the claims:

Claim 16, line 2, change "15" to --17--.

Signed and Sealed this

Ninth Day of May, 2000

*Attest:*

Q. TODD DICKINSON

*Attesting Officer*       *Director of Patents and Trademarks*